United States Patent
Borisov et al.

(10) Patent No.: US 10,462,942 B2
(45) Date of Patent: Oct. 29, 2019

(54) STRUCTURAL FRAME COOLING MANIFOLD

(71) Applicant: Johnson Controls Technology Company, Plymouth, MI (US)

(72) Inventors: Konstantin Borisov, York, PA (US); Mark A. Nielsen, New Freedom, PA (US); Jeffrey A. Martinelli, Middletown, PA (US); Brian L. Stauffer, York, PA (US); Seth K. Gladfelter, York, PA (US); Michael S. Todd, Jacobus, PA (US); Ivan Jadric, York, PA (US); Jeb W. Schreiber, Stewartstown, PA (US); Tim Beckley, York, PA (US)

(73) Assignee: Johnson Controls Technology Company, Auburn Hills, MI (US)

( * ) Notice: Subject to any disclaimer, the term of this patent is extended or adjusted under 35 U.S.C. 154(b) by 0 days.

(21) Appl. No.: 15/592,018

(22) Filed: May 10, 2017

(65) Prior Publication Data
US 2017/0245402 A1 Aug. 24, 2017

Related U.S. Application Data

(63) Continuation of application No. 14/962,148, filed on Dec. 8, 2015, now Pat. No. 9,654,017.
(Continued)

(51) Int. Cl.
*H05K 7/20* (2006.01)
*H02M 5/40* (2006.01)
(Continued)

(52) U.S. Cl.
CPC ....... *H05K 7/20936* (2013.01); *F25B 31/006* (2013.01); *H02M 5/40* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 5,435,155 A * 7/1995 Paradis ............... F25B 39/02
165/135
5,617,307 A * 4/1997 Guigueno ............ H02M 7/003
361/709
(Continued)

FOREIGN PATENT DOCUMENTS

CN 102195453 A 9/2011
CN 202395642 U 8/2012
(Continued)

OTHER PUBLICATIONS

JP Office Action for JP Application No. 2017-549171 dated Apr. 25, 2018, 3 pgs.
(Continued)

*Primary Examiner* — Anthony M Haughton
*Assistant Examiner* — Razmeen Gafur
(74) *Attorney, Agent, or Firm* — Fletcher Yoder, P.C.

(57) ABSTRACT

A variable speed drive includes a converter connected to an AC power source, a DC link connected to the converter, and an inverter connected to the DC link. The inverter converts DC voltage into an output AC power having a variable voltage and frequency. The inverter includes at least one power electronics module and associated control circuitry; a heat sink in thermal communication with the power electronics module and in fluid communication with a manifold. The manifold includes a tubular member having at least one vertical member portion and at least one horizontal member portion in fluid communication. A plurality of ports conduct cooling fluid into and out of the manifold. A bracket attaches
(Continued)

the manifold to a structural frame. Brackets are provided for attachment of power electronics modules to the manifold.

20 Claims, 8 Drawing Sheets

Related U.S. Application Data

(60) Provisional application No. 62/088,730, filed on Dec. 8, 2014.

(51) Int. Cl.
    *F25B 31/00*     (2006.01)
    *H02P 27/06*     (2006.01)

(52) U.S. Cl.
    CPC ......... *H02P 27/06* (2013.01); *H05K 7/20327* (2013.01); *H05K 7/20354* (2013.01); *H05K 7/20381* (2013.01); *H05K 7/20927* (2013.01)

(58) Field of Classification Search
    CPC ... H05K 7/20009–202; H05K 7/20936; H05K 7/20327; H05K 7/20354; H05K 7/20381; H05K 7/20927; H01L 23/367–3677; H01L 23/473; H01L 23/46–467; F25B 31/006; H02M 5/40; H02P 27/06
    USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
    See application file for complete search history.

(56) References Cited

U.S. PATENT DOCUMENTS

| | | | | |
|---|---|---|---|---|
| 5,914,860 A * | 6/1999 | Janko | F28F 13/00 | 361/710 |
| 5,915,815 A * | 6/1999 | Moore | F26B 25/006 | 34/132 |
| 6,160,696 A | 12/2000 | Bailey et al. | | |
| 6,885,553 B2 * | 4/2005 | Pfeifer | F28F 3/12 | 257/E23.098 |
| 6,951,892 B2 * | 10/2005 | Pardikes | B01F 3/0811 | 162/168.1 |
| 7,640,767 B2 | 1/2010 | Schnetzka et al. | | |
| 7,898,374 B2 * | 3/2011 | Miller | H02P 1/18 | 200/307 |
| 7,965,509 B2 * | 6/2011 | Campbell | H01L 23/473 | 165/104.33 |
| 8,508,181 B2 * | 8/2013 | Broussard | H02M 7/003 | 318/400.3 |
| 9,719,698 B2 * | 8/2017 | Archer | F28D 7/06 | |
| 2001/0030881 A1 | 10/2001 | Yamaguchi et al. | | |
| 2001/0036061 A1 | 11/2001 | Donahoe et al. | | |
| 2002/0135981 A1 | 9/2002 | Pautsch | | |
| 2004/0062006 A1 | 4/2004 | Pfeifer et al. | | |
| 2005/0056313 A1 * | 3/2005 | Hagen | B01F 5/0453 | 137/3 |
| 2005/0207134 A1 | 9/2005 | Belady et al. | | |
| 2006/0007720 A1 * | 1/2006 | Pfeifer | H05K 7/20927 | 363/141 |
| 2006/0082970 A1 | 4/2006 | Walz et al. | | |
| 2006/0126295 A1 | 6/2006 | Tilton et al. | | |
| 2008/0001408 A1 * | 1/2008 | Liu | F03D 7/00 | 290/44 |
| 2008/0008604 A1 * | 1/2008 | Tolbert | F04B 39/08 | 417/364 |
| 2008/0212282 A1 | 9/2008 | Hall et al. | | |
| 2008/0310113 A1 | 12/2008 | Renders et al. | | |
| 2009/0073658 A1 | 3/2009 | Balcerak et al. | | |
| 2009/0115491 A1 | 5/2009 | Anwar et al. | | |
| 2009/0223231 A1 * | 9/2009 | Snow, III | F24F 1/10 | 62/77 |
| 2009/0231811 A1 | 9/2009 | Tokuyama et al. | | |
| 2009/0262501 A1 | 10/2009 | Claassen et al. | | |
| 2010/0071396 A1 | 3/2010 | Jadric et al. | | |
| 2010/0157531 A1 | 6/2010 | Mason et al. | | |
| 2010/0245179 A1 | 9/2010 | Puzella et al. | | |
| 2010/0246117 A1 | 9/2010 | Brunschwiler et al. | | |
| 2010/0277868 A1 | 11/2010 | Beaupre et al. | | |
| 2010/0309630 A1 | 12/2010 | Jones et al. | | |
| 2010/0321896 A1 | 12/2010 | Yamada | | |
| 2011/0016915 A1 * | 1/2011 | Rockenfeller | F25B 27/00 | 62/498 |
| 2011/0018472 A1 * | 1/2011 | Rockenfeller | H02P 5/74 | 318/51 |
| 2011/0026225 A1 | 2/2011 | Ostwald et al. | | |
| 2011/0069455 A1 * | 3/2011 | Tokuyama | H01L 23/473 | 361/702 |
| 2011/0134604 A1 * | 6/2011 | Attlesey | G06F 1/20 | 361/679.47 |
| 2011/0317367 A1 * | 12/2011 | Campbell | H05K 7/20809 | 361/700 |
| 2012/0026691 A1 | 2/2012 | Campbell et al. | | |
| 2012/0167855 A1 * | 7/2012 | Palazzolo | F01M 11/02 | 123/195 R |
| 2012/0217802 A1 * | 8/2012 | Kanakasabai | H02J 3/36 | 307/32 |
| 2012/0327602 A1 | 12/2012 | Kulkarni et al. | | |
| 2012/0327603 A1 | 12/2012 | Beaupre et al. | | |
| 2013/0014708 A1 * | 1/2013 | Smelcer | F23D 14/02 | 122/14.2 |
| 2013/0050944 A1 | 2/2013 | Shepard | | |
| 2013/0079932 A1 * | 3/2013 | Burton | F24F 11/0012 | 700/278 |
| 2013/0094139 A1 | 4/2013 | Campbell et al. | | |
| 2013/0098085 A1 * | 4/2013 | Judge | H05K 7/20827 | 62/180 |
| 2013/0098087 A1 * | 4/2013 | Noll | F25B 49/02 | 62/222 |
| 2013/0136435 A1 * | 5/2013 | Graibus | F22B 1/287 | 392/391 |
| 2013/0312433 A1 * | 11/2013 | Nemit, Jr. | F24F 1/12 | 62/56 |
| 2013/0322016 A1 | 12/2013 | Jones et al. | | |
| 2014/0127059 A1 * | 5/2014 | Haley | F04D 17/122 | 417/423.1 |
| 2014/0158320 A1 * | 6/2014 | Archer | F28D 7/06 | 165/45 |
| 2014/0196484 A9 * | 7/2014 | Chen | F25B 47/025 | 62/81 |
| 2014/0240916 A1 * | 8/2014 | Daidzic | B23P 15/26 | 361/679.46 |
| 2014/0246169 A1 * | 9/2014 | Perrin | H05K 7/2089 | 165/47 |
| 2014/0376184 A1 * | 12/2014 | Gohara | H01L 23/473 | 361/689 |
| 2015/0116937 A1 * | 4/2015 | Huesgen | H05K 5/0091 | 361/696 |
| 2015/0173252 A1 * | 6/2015 | Zeighami | H05K 7/20781 | 340/606 |
| 2015/0184660 A1 * | 7/2015 | Schramm | F04D 13/086 | 417/250 |
| 2015/0216073 A1 * | 7/2015 | Tyleshevski | H05K 7/20909 | 361/692 |
| 2015/0275891 A1 * | 10/2015 | Chong | F04B 53/006 | 417/53 |
| 2015/0334879 A1 * | 11/2015 | Fricker | H05K 7/20809 | 361/679.47 |
| 2015/0359132 A1 * | 12/2015 | Campbell | H05K 7/20236 | 361/700 |
| 2016/0016104 A1 * | 1/2016 | Scofield | F24F 3/1603 | 96/420 |
| 2016/0069624 A1 * | 3/2016 | Rollins | F04D 25/028 | 415/122.1 |
| 2016/0120067 A1 * | 4/2016 | McDonnell | F25B 31/006 | 361/700 |

(56) References Cited

U.S. PATENT DOCUMENTS

| | | | |
|---|---|---|---|
| 2016/0128238 A1* | 5/2016 | Shedd | F25B 23/006 361/679.47 |
| 2016/0187010 A1* | 6/2016 | Vandermeulen | B01D 53/263 62/186 |
| 2016/0290671 A1* | 10/2016 | Schuster | F25B 49/022 |
| 2016/0365817 A1* | 12/2016 | Schuster | H02P 23/26 |
| 2017/0003072 A1* | 1/2017 | Holt | F03B 13/00 |
| 2017/0030601 A1* | 2/2017 | Blanton | F25B 5/02 |
| 2017/0044985 A1* | 2/2017 | Sanchez | F01D 25/24 |
| 2017/0045255 A1* | 2/2017 | Karamanos | G05D 7/0635 |
| 2017/0074207 A1* | 3/2017 | Palazzolo | F01M 11/02 |
| 2017/0077859 A1* | 3/2017 | Chretien | H02P 27/06 |
| 2017/0085153 A1* | 3/2017 | Jahshan | H02P 23/00 |
| 2018/0058463 A1* | 3/2018 | Rollins | F04D 25/0606 |
| 2018/0141409 A1* | 5/2018 | Miyakoshi | B60H 1/00385 |

FOREIGN PATENT DOCUMENTS

| | | |
|---|---|---|
| DE | 4225675 A1 | 2/1994 |
| EP | 0767601 A1 | 4/1997 |
| JP | S57113692 U | 7/1982 |
| JP | S6337698 A | 2/1988 |
| JP | 64-28848 A | 1/1989 |
| JP | 2009-295916 A | 12/2009 |

OTHER PUBLICATIONS

Taiwanese Office Action for TW Application No. 106115148 dated Nov. 28, 2017, 15 pgs.

Chinese Office Action for CN Application No. 201580006852.4 dated Dec. 27, 2017, 6 pgs.

JP Office Action for JP Application No. 2017-549171 dated Feb. 5, 2019, 2 pgs.

* cited by examiner

STRUCTURAL FRAME COOLING MANIFOLD

CROSS REFERENCE TO RELATED APPLICATIONS

This application is a continuation of U.S. patent application Ser. No. 14/962,148, entitled "STRUCTURAL FRAME COOLING MANIFOLD," filed Dec. 8, 2015, which claims priority from and the benefit of U.S. Provisional Application Ser. No. 62/088,730, entitled "STRUCTURAL FRAME COOLING MANIFOLD," filed Dec. 8, 2014, which are hereby incorporated by reference in their entireties.

BACKGROUND

The application generally relates to a cooling manifold for a variable speed drive. The application relates more specifically to a structural frame cooling manifold for a variable speed drive.

Electrical panels that house power switching devices generate significant heat that must be removed so that the electronic components do not fail due to overtemperature. Electrical panels used in applications such as variable speed drives used in motor control and HVAC applications have typically used hoses for coolant distribution and steel members for structural support.

The present disclosure discloses a single part that functions as both a cooling fluid manifold and a structural member. Hoses may fail and cause liquid to contact energized components or buses inside the electrical gear, causing short circuits or equipment shutdowns. The disclosed arrangement eliminates or minimizes the use of hoses and provides cooling passages integrated with structural members that support the electrical cabinet and electronic components mounted within the cabinet.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to a variable speed drive includes a converter connected to an AC power source, a DC link connected to the converter, and an inverter connected to the DC link, the inverter configured to convert a DC voltage from the DC link into an output AC power having a variable voltage and a variable frequency, the inverter further comprising: at least one power electronics module and associated control circuitry; a nonconductive heat sink in thermal communication with the power electronics module and in fluid communication with a manifold, the manifold comprising a hollow tubular member, a plurality of ports for conducting a cooling fluid into and from the tubular member, at least one bracket for attachment of the manifold to a structural frame, and at least one bracket for attachment of the at least one power electronics module to the tubular member. In an exemplary embodiment the tubular member includes at least one vertical member portion in fluid communication with at least one horizontal member portion.

Another embodiment relates to a manifold including a hollow tubular member having at least one vertical member portion and at least one horizontal member portion in fluid communication, a plurality of ports for conducting a cooling fluid into and from the manifold, at least one bracket for attachment of the manifold to a structural frame, and at least one bracket for attachment of a power electronics module to the manifold.

Certain advantages of the embodiments described herein include a structural frame for a VSD that includes a manifold. The manifold may be constructed of hollow stainless steel tubing for circulating a liquid coolant. The manifold provides distribution ports for connection to VSD cooling blocks. The manifold reduces complexity of the distribution of cooling fluid in the VSD, through minimization of the hoses within the VSD. The manifold also provides structural support for components in the VSD. Reduces complexity of the cooling system design through minimization of the hoses in the liquid cooled VSDs. Any non-corrosive material may be used for the manifold tubing, or to coat the manifold tubing to prevent corrosion, e.g., non-corrosive metal, ceramic or polymer materials.

Alternative exemplary embodiments relate to other features and combinations of features as may be generally recited in the claims.

DETAILED DESCRIPTION OF THE EXEMPLARY EMBODIMENTS

Figure 1:
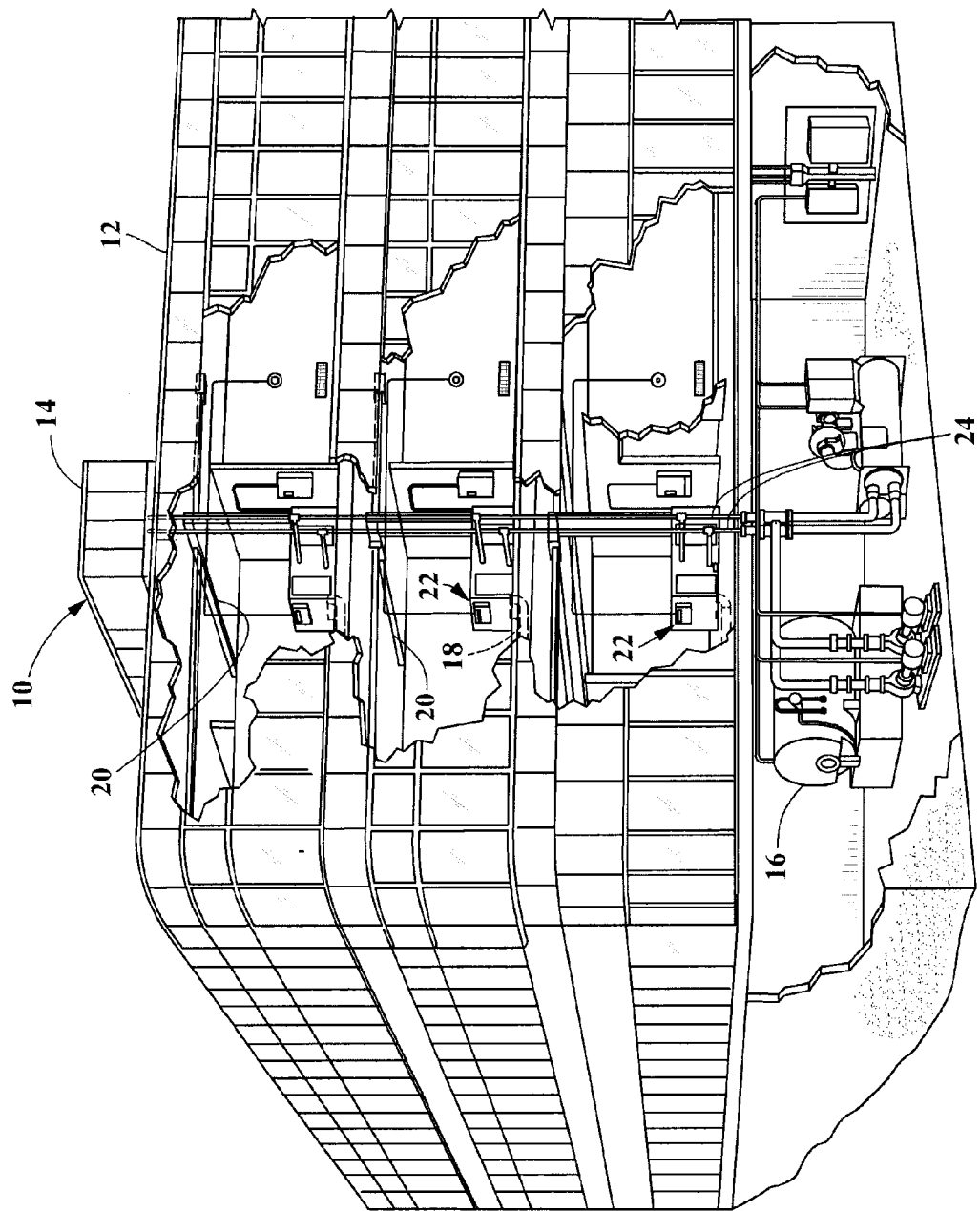
FIG. 1 shows an exemplary embodiment of a Heating, Ventilation, Air Conditioning and Refrigeration (HVAC&R) system in a commercial environment.

FIG. 1 shows an exemplary environment for a Heating, Ventilating, Air Conditioning system (HVAC system) 10 in a building 12 for a typical commercial setting. System 10 may include a compressor incorporated into a vapor compression system 14 that can supply a chilled liquid that may be used to cool building 12. System 10 can also include a boiler 16 to supply a heated liquid that may be used to heat building 12, and an air distribution system that circulates air through building 12. The air distribution system can include an air return duct 18, an air supply duct 20 and an air handler 22. Air handler 22 can include a heat exchanger that is connected to boiler 16 and vapor compression system 14 by conduits 24. The heat exchanger in air handler 22 may receive either heated liquid from boiler 16 or chilled liquid from vapor compression system 14 depending on the mode of operation of system 10. System 10 is shown with a separate air handler on each floor of building 12, but it will be appreciated that these components may be shared between or among floors.

Figure 2:
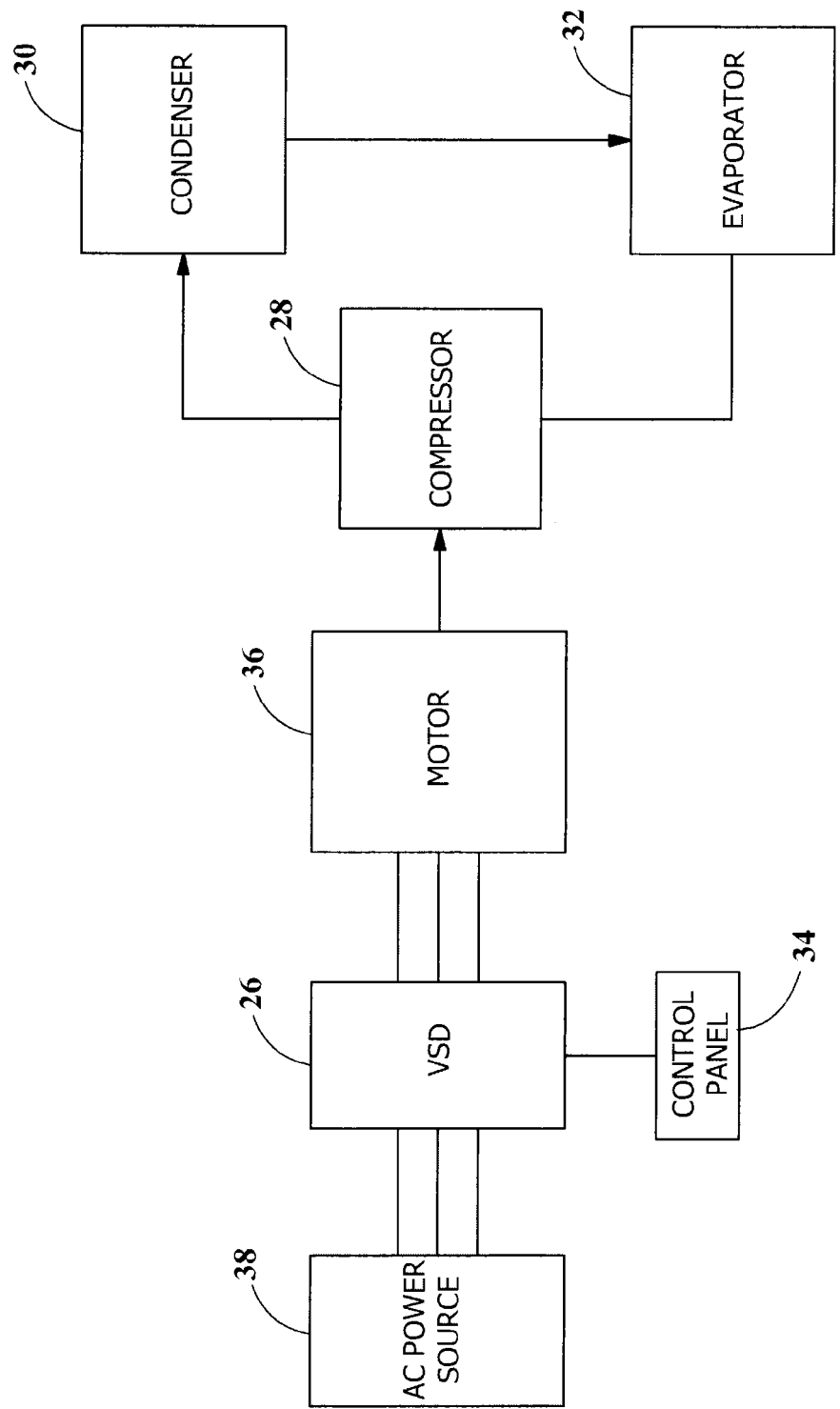
FIG. 2 schematically illustrates an exemplary embodiment of a vapor compression system that may be used in the exemplary embodiment of FIG. 1.

FIG. 2 schematically illustrates an exemplary embodiment of vapor compression system 14 with VSD 26 that may be used in building 12 in FIG. 1. Vapor compression system 14 may include compressor 28, a condenser 30, a liquid chiller or evaporator 32 and a control panel 34. Compressor 28 is driven by motor 36 that is powered by VSD 26. VSD 26 receives AC power having a particular fixed line voltage and fixed line frequency from AC power source 38 and provides AC power to motor 36 at desired voltages and desired frequencies, both of which can be varied to satisfy particular requirements. Control panel 34 can include a variety of different components such as an analog to digital (A/D) converter, a microprocessor, a non-volatile memory, and an interface board, to control operation of vapor compression system 14. Control panel 34 can also be used to control the operation of VSD 26, and motor 36.

Compressor 28 compresses a refrigerant vapor and delivers the vapor to condenser 30 through a discharge line. Compressor 28 can be any suitable type of compressor, for example, a screw compressor, a centrifugal compressor, a reciprocating compressor, a scroll compressor, etc. The refrigerant vapor delivered by compressor 28 to condenser 30 enters into a heat exchange relationship with a fluid, for example, air or water, and undergoes a phase change to a refrigerant liquid as a result of the heat exchange relationship with the fluid. The condensed liquid refrigerant from condenser 30 flows through an expansion device (not shown) to evaporator 32.

Evaporator 32 may include connections for a supply line and a return line of a cooling load. A process fluid, for example, water, ethylene glycol, calcium chloride brine or sodium chloride brine, travels into evaporator 32 via return line and exits evaporator 32 via supply line. The liquid refrigerant in evaporator 32 enters into a heat exchange relationship with the process fluid to lower the temperature of the process fluid. The refrigerant liquid in evaporator 32 undergoes a phase change to a refrigerant vapor as a result of the heat exchange relationship with the process fluid. The vapor refrigerant in evaporator 32 exits evaporator 32 and returns to compressor 28 by a suction line to complete the cycle.

Figure 3:
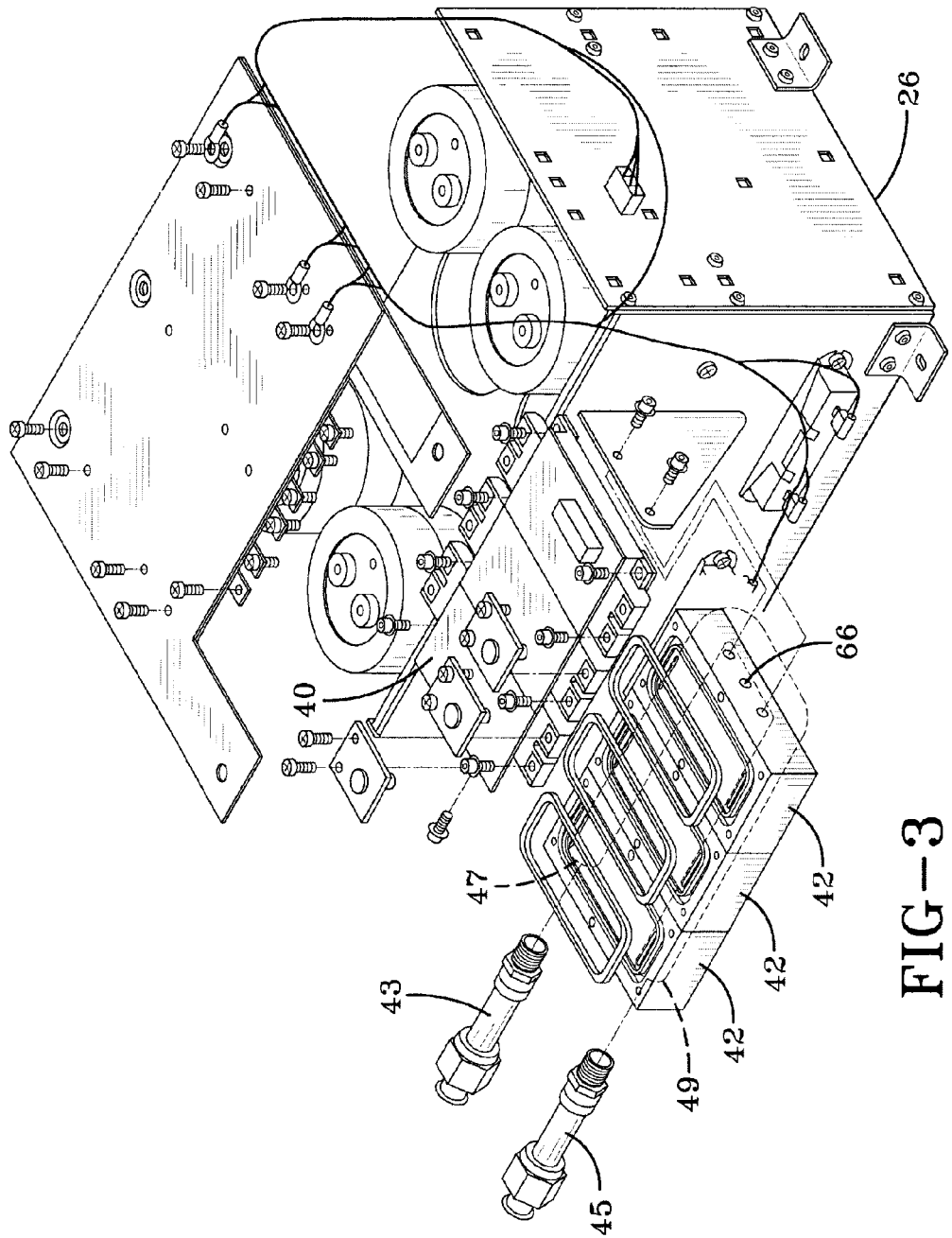
FIG. 3 shows an exploded view of a portion of a variable speed drive system with an exemplary embodiment of a cooling member.

FIG. 3 shows one part of a variable speed drive 26 with a plurality of switches 40 that are placed over cooling members 42. VSD 26 may be used to provide desired power to motors for different applications or HVAC systems. For example, such a motor may drive a compressor of a vapor compression system. Switches 40 of the VSD 26 are depicted as an Infineon module with 3 dual IGBT's, but other semiconductor devices or other electronic components that require cooling may be cooled with cooling members 42. Pipes 43, 45 are connected to inlet passageway 47 and outlet passageway 49, respectively to introduce cooling fluid into and remove cooling fluid from cooling members 42. Pipes 43 and 45 or other suitable flow passages are connected to a cooling system, which provides a continuous flow of cooling fluid to cooling members 42. A cooling fluid is applied to pipe 43, flows through the member 42, and flows out through pipe 45.

A variety of different cooling fluids, including condensed water, water, and known refrigerants can be circulated in cooling members 42 and used to cool the electronic components. In addition, a variety of different cooling systems can be used to cool the cooling fluid that exits from cooling members 42.

Cooling members 42 cool modules in a VSD 26 used to power a motor of an HVAC system. The modules can be connected to cooling member 42 in a sealed relationship. The cooling fluid applied to cooling member 42 can be water that flows through cooling member 42 and a heat exchanger in a closed loop. The heat exchanger cools the water before it is reintroduced to cooling member 42. The heat exchanger can be a shell and tube type heat exchanger and water from a cooling tower of the HVAC system can be used to cool the water applied to cooling member 42.

Figure 4:
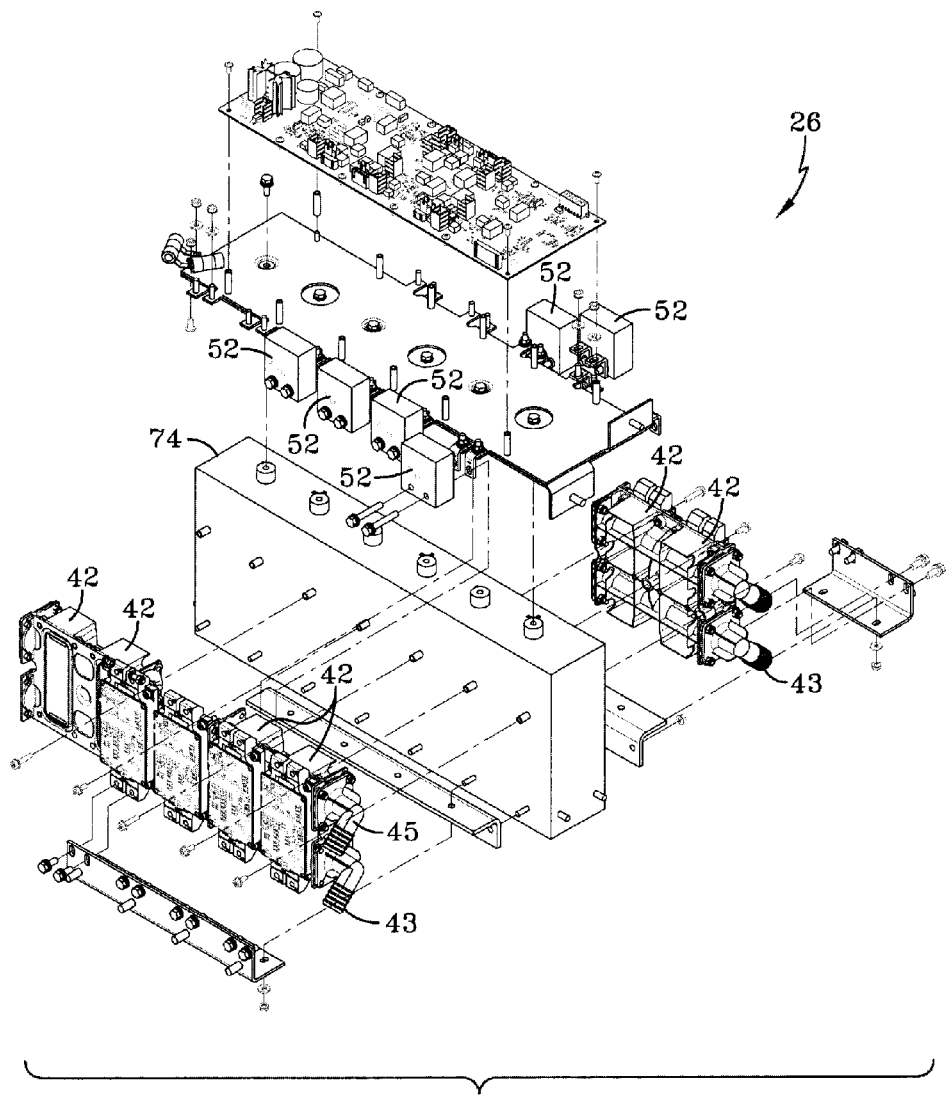
FIG. 4 shows a plurality of cooling members located on a power electronics assembly in an exemplary embodiment.

FIG. 4 shows a plurality of cooling members 42 to be mounted to a component of VSD 26. Cooling members 42 are positioned vertically and mounted on the side of components 74 (for example, dc link capacitors). In another embodiment, components 74 may be oriented in any suitable orientation, such as, vertical, horizontal, or diagonal.

Figure 5:
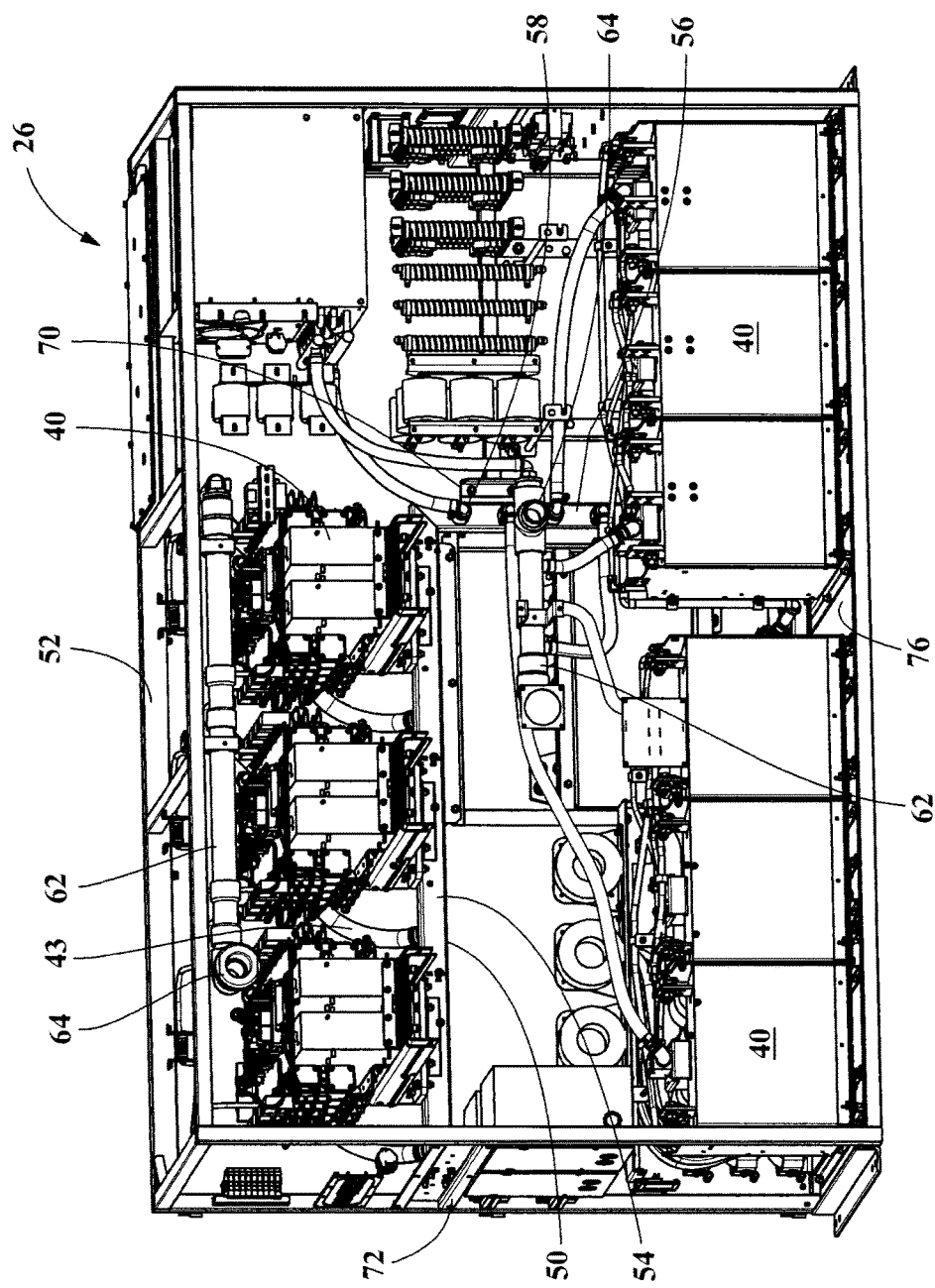
FIG. 5 shows an elevation view of an exemplary view of the internal components enclosed in the VSD.
Figure 6:
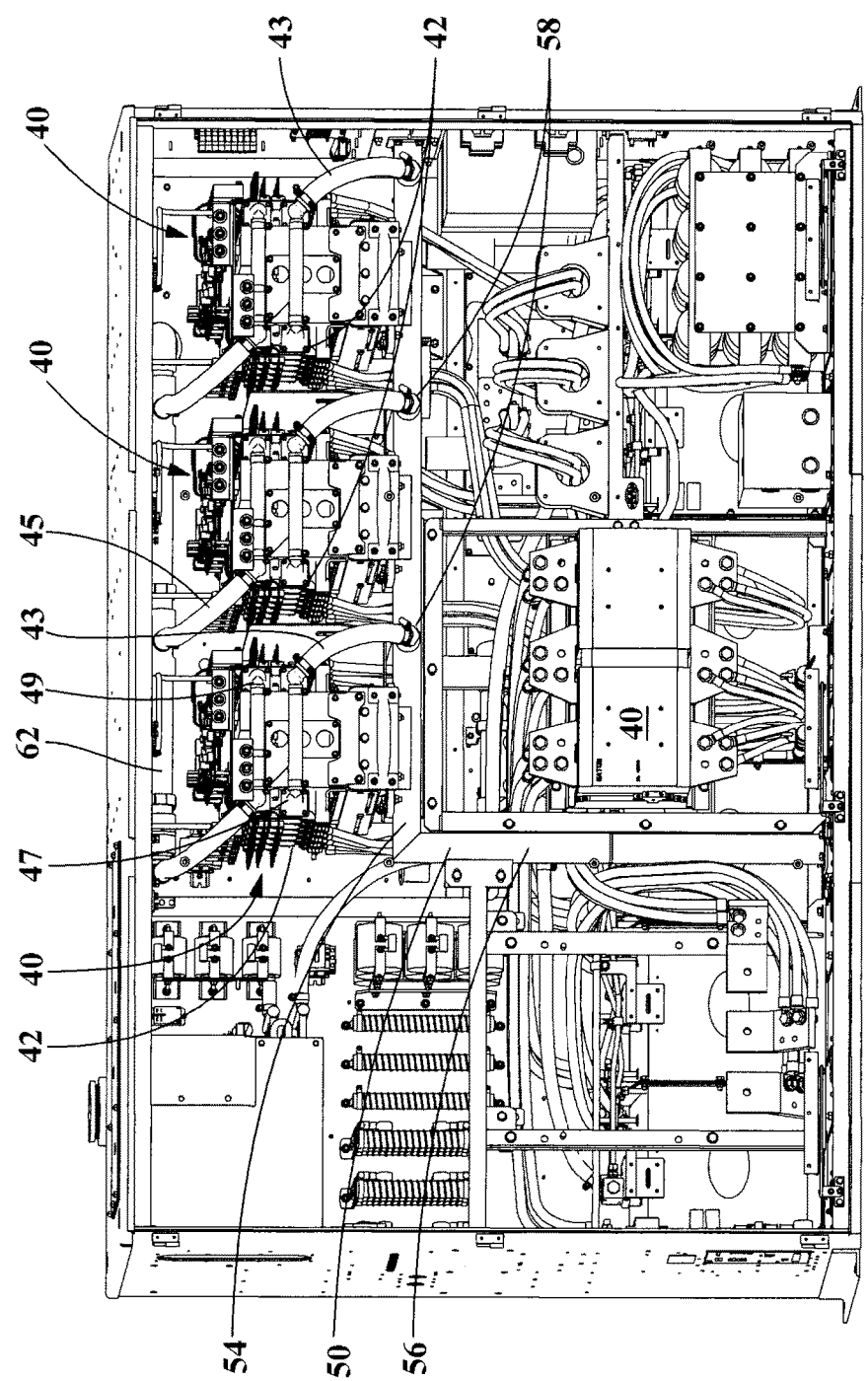
FIG. 6 shows an opposite side view of the internal components shown in FIG. 5.

Referring next to FIGS. 5 and 6, an elevation view of an exemplary view of the internal components enclosed in the VSD 26 is shown. A manifold 50 is mounted within a frame 52 of VSD 26. Manifold 50 includes a horizontal tubular member 54 and a vertical tubular member 56 connected at a 90° angle, the horizontal tubular member 54 and vertical tubular member 56 in fluid communication for flow of cooling fluid to supply couplings or ports 58. Supply ports 58 are connected in flow communication with inlet passageways 47 of cooling members 42 through hose sections 43, to provide cooling fluid to cooling members 42 mounted on switches 40. After the cooling fluid circulates through cooling members 42, cooling fluid exits cooling members 42 through outlet passageways 49 and flows into a return conduit 62, and exits VSD 26 at discharge ports 64 in flow communication with conduit 62. At least one supply port 58 is designated as an inlet port connected to a source (not shown) for receiving cooling fluid into manifold 50.

Figure 7:
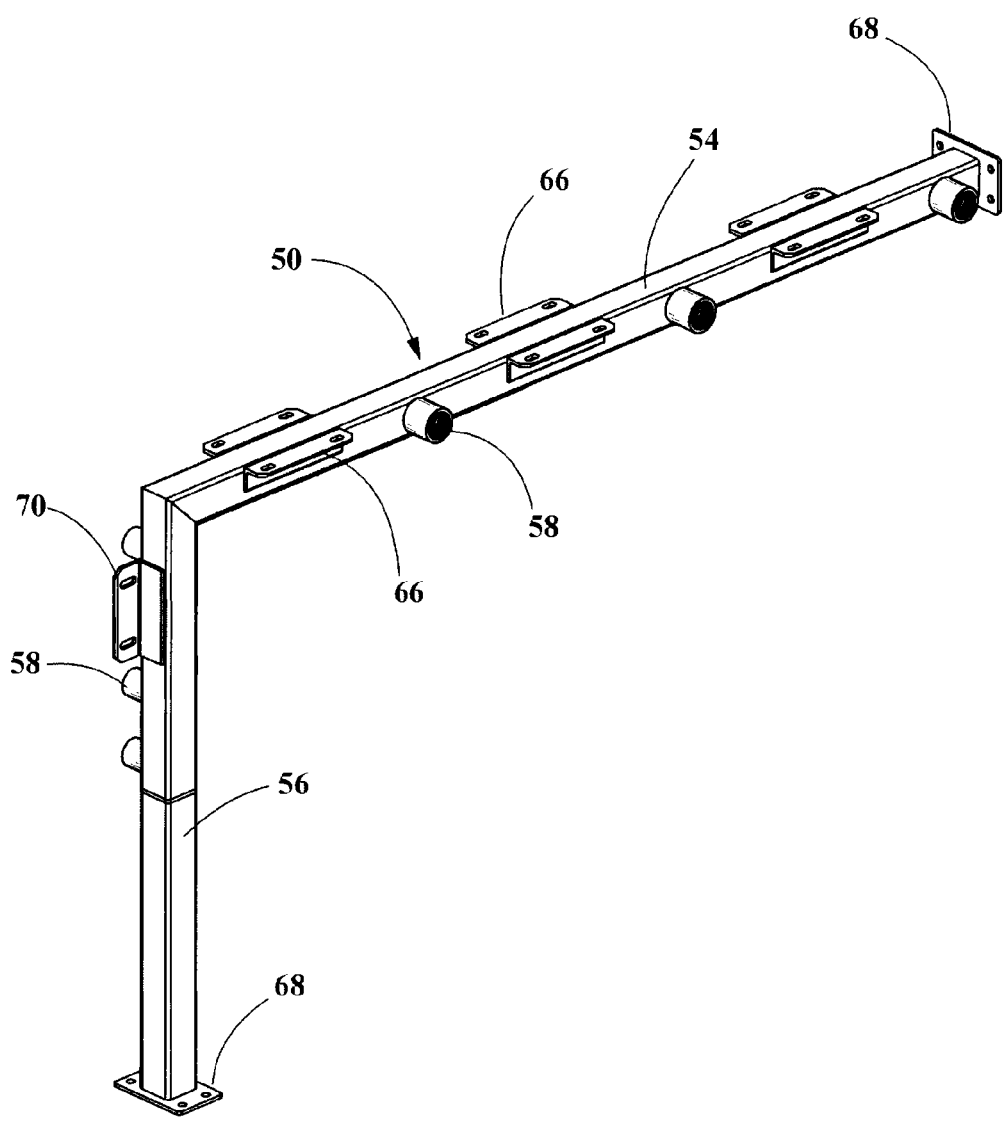
FIG. 7 shows a perspective view of an exemplary cooling manifold.
Figure 8:
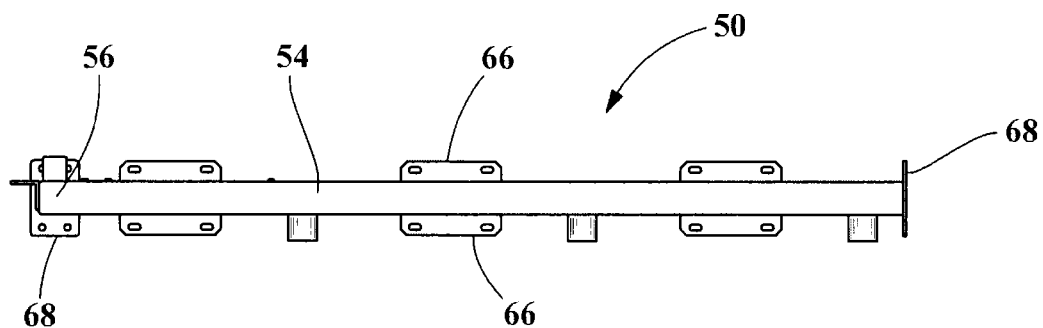
FIG. 8 shows a plan view of the cooling manifold of FIG. 7.
Figure 9:
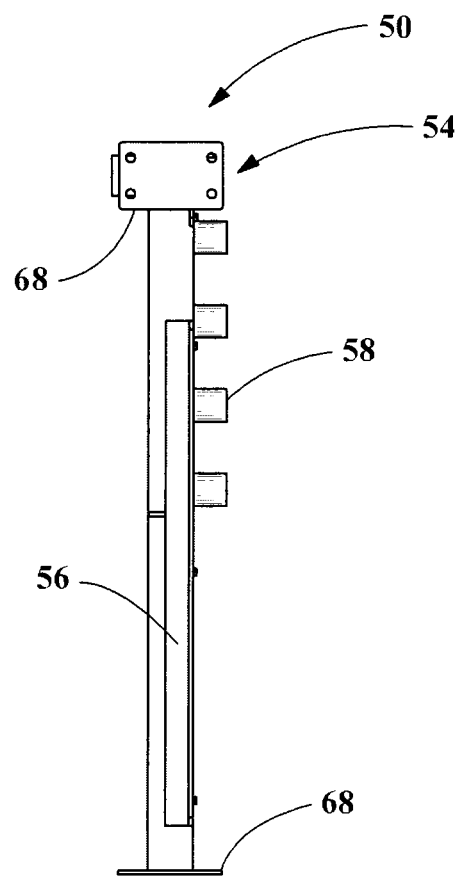
FIG. 9 shows an end view of the cooling manifold of FIG. 7.

Referring to FIGS. 7-9, an exemplary cooling manifold 50 is shown. A plurality of ports 58 are located along horizontal manifold section 54 and vertical manifold section 56. The number and location of ports 58 may vary depending on the application, e.g., the number of switches 40 and their locations within frame 52. Angle brackets 66 are provided along horizontal manifold section 54 for attachment of switches 40. End brackets 68 are located at a distal end of horizontal and vertical manifold sections 54, 56 for attachment to frame section 52 at an end panel 72 and a base 76, respectively. An auxiliary angle bracket 70 may also be attached to manifold 50 adjacent the intersection of vertical manifold section 56 with horizontal manifold section 58 for connecting manifold 50 to internal frame members 78.

Manifold 50 provides structural support to the frame 52 and switches 40 while using the same space as a conduit for cooling fluid. The dual purpose manifold provides additional useful space within the VSD 26 and reduces the amount of hose needed to connect cooling members 42 with a source of cooling fluid.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the variable speed drive as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. A cooling system for a variable speed drive (VSD), comprising:
    a manifold coupled to a frame of the VSD and a VSD component to provide structural support to the frame of the VSD and the VSD component;
    a cooling member coupled to the manifold and in a heat exchange relationship with the VSD component;
    a fluid passageway of the manifold configured to flow a cooling fluid through the manifold; and
    a plurality of ports disposed along the manifold, wherein the plurality of ports is in fluid communication with the fluid passageway and the cooling member, such that the plurality of ports enable the cooling fluid to flow between the fluid passageway and the cooling member.

2. The system of claim 1, wherein the plurality of ports is in fluid communication with a cooling fluid source, such that the plurality of ports is configured to receive the cooling fluid from the cooling fluid source, direct the cooling fluid from the fluid passageway to the cooling member, and discharge the cooling fluid back to the cooling fluid source.

3. The system of claim 2, wherein the cooling fluid source is a heat exchanger configured to transfer thermal energy from the cooling fluid to a working fluid of the heat exchanger.

4. The system of claim 3, wherein the working fluid of the heat exchanger is a refrigerant of a heating, ventilating, and air conditioning (HVAC) system.

5. The system of claim 1, wherein the cooling member and the VSD component are in a sealed relationship with one another.

6. The system of claim 1, wherein the VSD component is a switch of an inverter of the VSD.

7. The system of claim 1, wherein the VSD component is a direct current (DC) link capacitor.

8. The system of claim 1, wherein the manifold comprises a first member coupled to a base of the frame of the VSD and a second member coupled to an end panel of the frame of the VSD, wherein the plurality of ports is disposed along the second member.

9. The system of claim 8, wherein the first member is oriented vertically with respect to the base of the frame of the VSD and the second member is oriented horizontally with respect to the base of the frame of the VSD.

10. The system of claim 1, wherein the manifold is fabricated from a non-corrosive material.

11. The cooling system of claim 10, wherein the non-corrosive material is stainless steel.

12. A heating, ventilating, and air conditioning (HVAC) system, comprising:
    a refrigerant loop;
    a compressor disposed along the refrigerant loop and configured to circulate a refrigerant through the refrigerant loop;
    a motor configured to drive the compressor;
    a variable speed drive (VSD) configured to supply power to the compressor, wherein the VSD comprises a frame and a plurality of components configured to supply alternating current (AC) power to the motor at a variable voltage and a variable frequency; and
    a cooling system for the VSD, comprising:
        a manifold coupled to the frame of the VSD and configured to provide structural support to the frame of the VSD and a component of the plurality of components of the VSD;
        a cooling member coupled to the manifold and in a heat exchange relationship with the component;
        a fluid passageway of the manifold configured to flow a cooling fluid through the manifold; and
        a plurality of ports disposed along the manifold, wherein the plurality of ports is in fluid communication with the fluid passageway and the cooling member, such that the plurality of ports enable the cooling fluid to flow between the fluid passageway and the cooling member.

13. The HVAC system of claim 12, wherein the plurality of components of the VSD comprises:
    a converter configured to couple to an AC power source providing an input AC voltage and to convert the input AC voltage to a direct current (DC) voltage;
    a DC link converter coupled to the converter, wherein the DC link converter is configured to filter the DC voltage and to store power from the converter; and
    an inverter coupled to the DC link and configured to convert the DC voltage from the DC link into the AC power supplied to the motor.

14. The HVAC system of claim 13, wherein the cooling member of the cooling system of the VSD is in the heat exchange relationship with a switch of the inverter.

15. The HVAC system of claim 14, wherein the cooling member and the switch are in a sealed relationship with one another.

16. The HVAC system of claim 13, wherein the cooling member of the cooling system of the VSD is in the heat exchange relationship with the DC link converter.

17. The HVAC system of claim 12, wherein the manifold is coated with a polymeric material, a ceramic material, or a combination thereof.

18. A method for cooling a component of a variable speed drive (VSD), comprising:
    receiving a flow of cooling fluid from a cooling fluid source through a first port of a manifold, wherein the manifold is coupled to a frame of the VSD and the manifold is configured to provide structural support to the frame of the VSD and the component the VSD;

directing the flow of cooling fluid through a fluid passageway of the manifold toward a second port of the manifold;

directing the flow of cooling fluid from the second port to a cooling member, wherein the cooling member is in a heat exchange relationship with the component of the VSD, such that the cooling fluid absorbs thermal energy from the component of the VSD;

directing the flow of cooling fluid from the cooling member to a third port of the manifold;

discharging the flow of cooling fluid from the manifold back to the cooling fluid source.

19. The method of claim 18, comprising directing the flow of cooling fluid from the third port into the fluid passageway of the manifold, and wherein discharging the flow of cooling fluid from the manifold back to the cooling fluid source comprises discharging the flow of cooling fluid through a fourth port of the manifold to the cooling fluid source.

20. The method of claim 18, comprising exchanging heat from the cooling fluid to a working fluid of a heat exchanger of the cooling fluid source after discharging the cooling fluid from the manifold.

\* \* \* \* \*